(12) United States Patent
Al-Bondak et al.

(10) Patent No.: US 10,903,542 B1
(45) Date of Patent: Jan. 26, 2021

(54) VARIABLE RADIO FREQUENCY ATTENUATOR

(71) Applicant: THE BOEING COMPANY, Chicago, IL (US)

(72) Inventors: Walid M. Al-Bondak, View Park, CA (US); Kyu-Pyung Hwang, Ladson, SC (US); Young Kyu Song, El Segundo, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/800,902

(22) Filed: Feb. 25, 2020

(51) Int. Cl.
| | | |
|---|---|---|
| *H01P 1/22* | (2006.01) | |
| *H01P 3/08* | (2006.01) | |
| *H01P 11/00* | (2006.01) | |
| *H03F 3/19* | (2006.01) | |

(52) U.S. Cl.
CPC .............. *H01P 1/227* (2013.01); *H01P 3/081* (2013.01); *H01P 11/003* (2013.01); *H03F 3/19* (2013.01); *H03F 2200/451* (2013.01)

(58) Field of Classification Search
CPC ........ H01P 1/227; H01P 3/081; H01P 11/003; H03F 3/19; H03F 2200/451
See application file for complete search history.

(56) References Cited

U.S. PATENT DOCUMENTS

| | | | |
|---|---|---|---|
| 5,045,820 A | 9/1991 | Leicht et al. | |
| 6,713,399 B1 | 3/2004 | Kao | |
| 7,213,327 B2 | 5/2007 | Su et al. | |
| 7,271,682 B1 | 9/2007 | Blacka | |
| 7,417,303 B2 | 8/2008 | Woo et al. | |
| 7,508,898 B2 | 3/2009 | Cyr et al. | |
| 8,227,892 B2 | 7/2012 | Chang et al. | |
| 9,348,189 B2 | 5/2016 | Ishitani et al. | |
| 2007/0176730 A1* | 8/2007 | Yan .................... | H01C 10/345 338/308 |
| 2012/0171967 A1 | 7/2012 | Zampardi et al. | |
| 2017/0373366 A1* | 12/2017 | Kuroiwa ................ | H01P 1/227 |

OTHER PUBLICATIONS

A. Bauer et al, Embedded resistors for microwave applications up to 50 GHz on printed circuit boards, Proceedings of the 43rd European Microwave Conference, pp. 1183-1186, Nuremberg, Germany, Oct. 7-10, 2013.
B. Mahler et al, "Printed circuit board embedded thin film resistors", IMS 2017 workshop, Honolulu, Hawaii, Jun. 7, 2017.

* cited by examiner

*Primary Examiner* — Nguyen T Vo
(74) *Attorney, Agent, or Firm* — Armstrong Teasdale LLP

(57) ABSTRACT

A variable RF attenuator includes a substrate, a first microstrip trace, a first thin film resistor, a second microstrip trace, and a wire bond. The substrate includes a dielectric layer. The first thin film resistor is disposed on the substrate. The first microstrip trace is disposed on the substrate and the first thin film resistor. The second microstrip trace is disposed on the substrate and is uncoupled from the first microstrip trace. The wire bond extends from the second microstrip trace to a position on the first microstrip trace. The position is selected to tune RF attenuation over a conductive path defined by the first microstrip trace, the wire bond, and the second microstrip trace.

20 Claims, 9 Drawing Sheets

US 10,903,542 B1

VARIABLE RADIO FREQUENCY ATTENUATOR

FIELD

The field of the disclosure relates generally to radio and microwave frequency systems and, more specifically, to a variable radio frequency (RF) attenuator.

BACKGROUND

Radio and microwave frequency (collectively referred to as RF) systems implemented in, for example, both military and commercial space systems (such as satellites) and aerospace systems, utilize various components, including RF attenuators and variable RF attenuators, sometimes referred to as digital RF attenuators. Conventional variable RF attenuators are discrete components, sometimes including analog switching components and coaxial connections that tend to be bulky. Some conventional variable RF attenuators may be implemented on a printed circuit board (PCB) and actively controlled, for example, digitally by a microprocessor, by a voltage supply, or both, or by some other suitable active control system. For example, an analog implementation of an RF attenuator on a PCB may feature coaxial connections and tunes its attenuation in response to a voltage applied to a terminal of the RF attenuator.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

One aspect is directed to a variable RF attenuator including a substrate, a first microstrip trace, a first thin film resistor, a second microstrip trace, and a wire bond. The substrate includes a dielectric layer. The first thin film resistor is disposed on substrate. The first microstrip trace is disposed on the substrate and the first thin film resistor. The second microstrip trace is disposed on the substrate and is uncoupled from the first microstrip trace. The wire bond extends from the second microstrip trace to a position on the first microstrip trace. The position is selected to tune RF attenuation over a conductive path defined by the first microstrip trace, the wire bond, and the second microstrip trace.

Another aspect is directed to a method of fabricating a variable RF attenuator. The method includes forming a first thin film resistor on a substrate, forming a first microstrip trace on the substrate and the first thin film resistor. The method also includes forming a second microstrip trace on the substrate. The second microstrip trace is uncoupled from the first microstrip trace. The method further includes coupling a wire bond to a first position on the first microstrip trace and coupling the wire bond to the second microstrip trace at a second position. The first position is selected to tune RF attenuation over a conductive path defined by the first microstrip trace, the wire bond, and the second microstrip trace.

Another aspect is directed to an RF system including a printed circuit board (PCB), an RF source, a variable RF attenuator, and an RF load. The PCB includes a ground plane and a substrate. The RF source is coupled to the variable RF attenuator via a first transmission line disposed on the substrate. The RF load is coupled to the variable RF attenuator via a second transmission line disposed on the substrate. The RF source is configured to transmit an RF signal over the first transmission line. The RF load is configured to receive an attenuated RF signal from over the second transmission line. The variable RF attenuator is disposed on the substrate and is coupled between the first transmission line and the second transmission line. The variable RF attenuator includes a first thin film resistor disposed on the substrate, and a first microstrip trace disposed on the substrate and the first thin film resistor. The first microstrip trace is coupled to the first transmission line. The variable RF attenuator also includes a second microstrip trace disposed on the substrate and uncoupled from the first microstrip trace. The second microstrip trace is coupled to the second transmission line. The variable RF attenuator also includes a wire bond extending from the second microstrip trace to a position on the first microstrip trace. The position is selected to tune RF attenuation over a conductive path defined by the first microstrip trace, the wire bond, and the second microstrip trace.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated examples may be incorporated into any of the above-described aspects, alone or in any combination.

Figure 1:
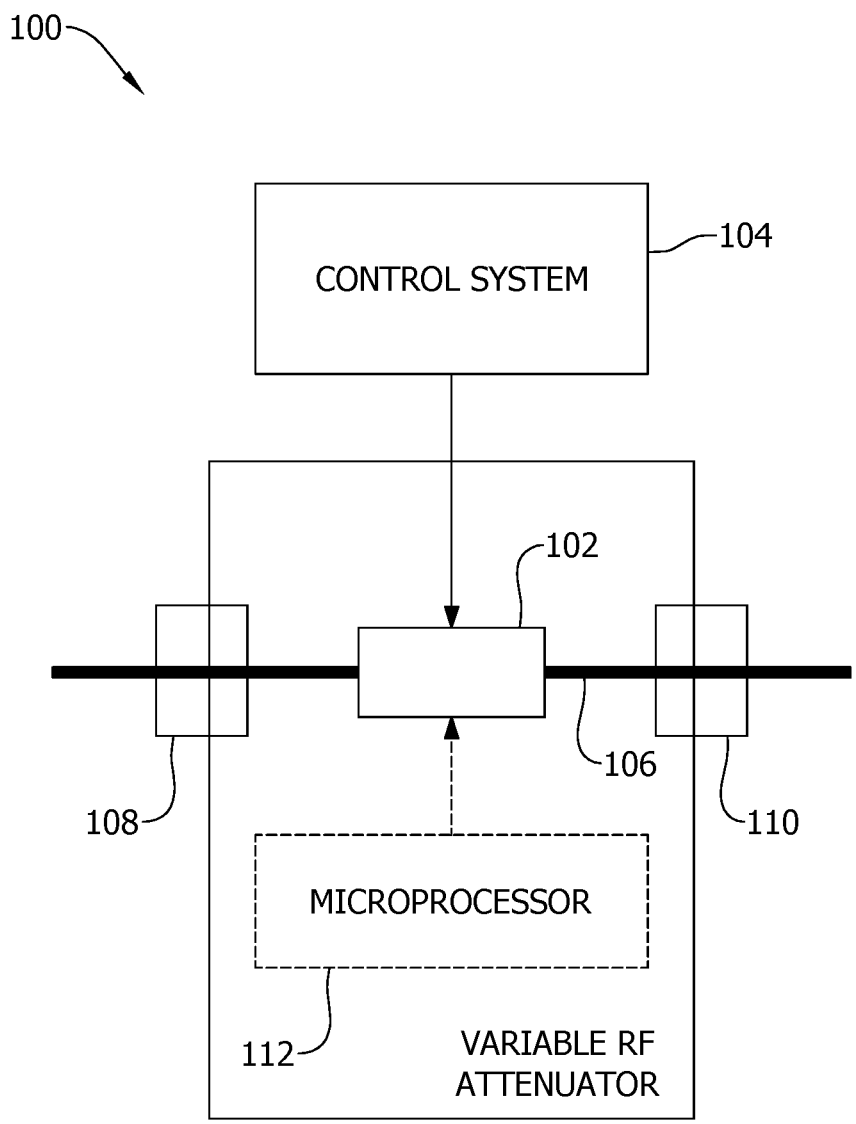
FIG. 1 is a block diagram of an example conventional variable RF attenuator.

Corresponding reference characters indicate corresponding parts throughout the several views of the drawings. Although specific features of various examples may be shown in some drawings and not in others, this is for convenience only. Any feature of any drawing may be referenced and/or claimed in combination with any feature of any other drawing.

DETAILED DESCRIPTION

FIG. 1 is a block diagram of an example conventional variable RF attenuator 100. Conventional variable RF attenuators, such as RF attenuator 100, generally include one or more discrete components 102 for adjusting attenuation that are controlled by a control system 104. Control system 104 may include analog switching devices, such as manually operated DIP switches or toggle switches. Alternatively, control system 104 may include an actively controlled voltage supply that applies a variable voltage to discrete components 102 to adjust attenuation of a transmission line 106 extending from an input connector 108 to an output connector 110. Transmission line 106 may include, for example, a coaxial transmission line. Likewise, input connector 108 and output connector 110 may include coaxial connectors. In another alternative, control system 104 may include a microprocessor that actively digitally controls discrete components 102 to adjust attenuation of transmission line 106. Similarly, in another alternative, a microprocessor 112 may be incorporated within RF attenuator 100 and is itself actively controlled or programmed by another remote device (not shown).

Figure 2:
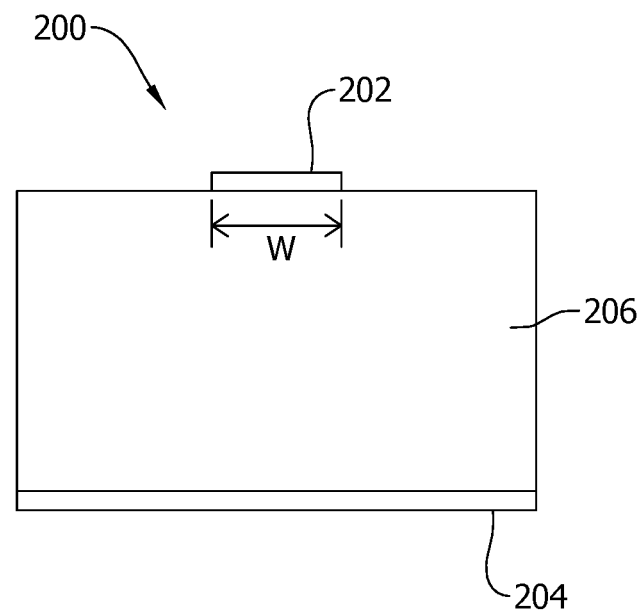
FIG. 2 is a front cross-section view of an example microstrip trace.
Figure 3:
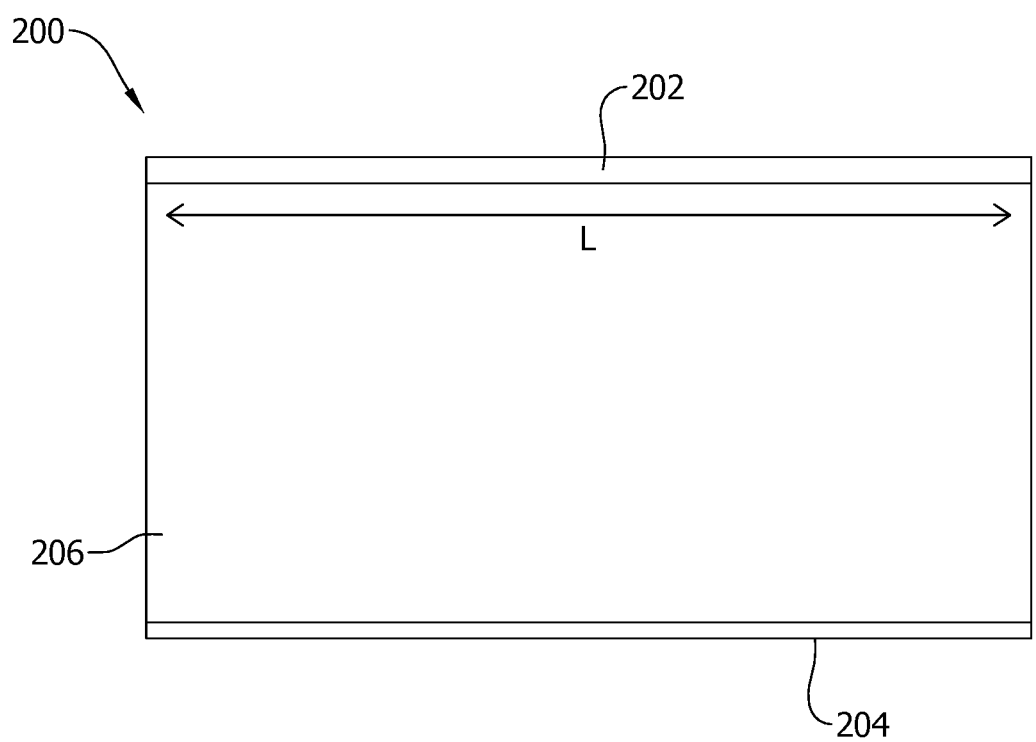
FIG. 3 is a side cross-section view of the microstrip trace shown in FIG. 2.

FIG. 2 is a front cross-section view of an example microstrip trace 200. FIG. 3 is a side cross-section view of microstrip trace 200 shown in FIG. 2. Generally, a microstrip trace, such as microstrip trace 200, includes a conductive trace 202 extending longitudinally over a ground plane 204, where conductive trace 202 and ground plane 204 are separated by a dielectric 206, e.g., silicon, gallium arsenide, indium phosphide, polytetrafluoroethylene (PTFE) or other polymer, or any other suitable dielectric material. Conductive layers, such as conductive trace 202 and ground plane 204 are generally formed from an electrically conductive material, such as copper or any other electrically conductive material suitable for use in RF circuit boards. The microstrip traces described herein may be fabricated, in certain embodiments, for example, by additive manufacturing methods, such as printing or film deposition, or both, or by subtractive methods, such as laser etching, milling, or wet etching.

Microstrip trace 200 is designed for efficient signal propagation at a desired operating frequency, e.g., in a range of 30 megahertz (MHz) to 300 gigahertz (GHz), and are further designed for impedance matching at, for example, transitions to other on-board components or discrete components, such as connectors. Generally, microstrip trace 200 has a width (W), shown in FIG. 2, corresponding to an impedance suitable for the operating frequency and for any transitions. Electromagnetic waves, e.g., RF signals, propagate along a longitudinal dimension (L), shown in FIG. 3.

Figure 4:
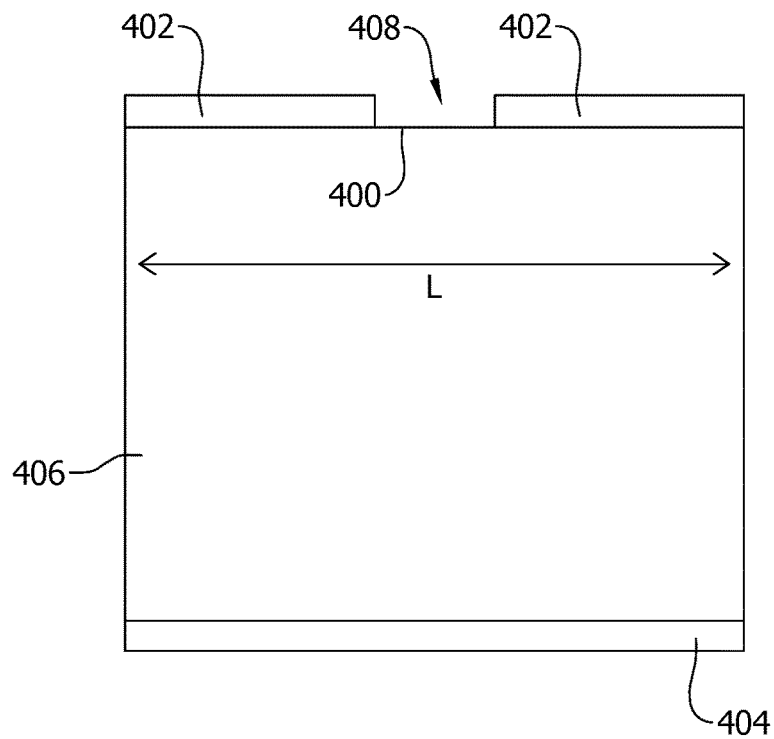
FIG. 4 is a side cross-section view of an example thin film resistor disposed under a microstrip trace.

FIG. 4 is a side cross-section view of an example thin film resistor 400 disposed under a microstrip trace 402 such that it is interposed between two sections of microstrip trace 402. Similar to microstrip trace 200 shown in FIGS. 2 and 3, microstrip trace 402 includes a conductive trace extending longitudinally over a ground plane 404, where the conductive trace and ground plane 404 are separated by a dielectric 406. Thin film resistor 400 interrupts microstrip trace 402 such that an RF signal propagating along the longitudinal dimension (L) must propagate through and be attenuated by thin film media of thin film resistor 400. The thin film media exhibits an electrical response that is practically purely resistive. Accordingly, the response of thin film resistor 400 is generally flat over a wide bandwidth. Conversely, microstrip traces 200 and 402 generally exhibit an impedance having both inductive and capacitive components, which are typically modelled and tuned for a given operating frequency.

Figure 5:
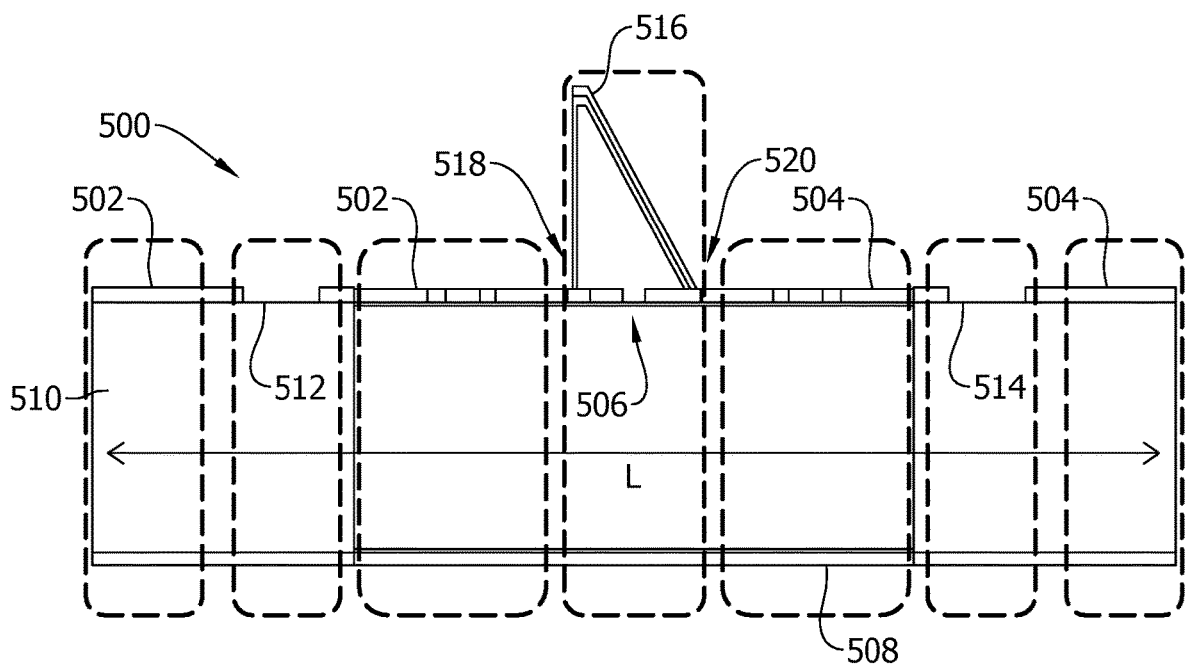
FIG. 5 is a side cross-section view of an example embodiment of a variable RF attenuator.

FIG. 5 is a side cross-section view of an example embodiment of a variable RF attenuator 500. Variable RF attenuator 500 includes a first microstrip trace 502 and a second microstrip trace 504 that are uncoupled as a function of a gap 506 between first microstrip trace 502 and second microstrip trace 504. First microstrip trace 502 and second microstrip trace 504 both extend longitudinally (L) over a ground plane 508 from which they are separated by a dielectric 510, e.g., silicon, gallium arsenide, indium phosphide, polytetrafluoroethylene (PTFE) or other polymer, or any other suitable dielectric material. Generally, RF signals propagate along a conductive path extending longitudinally (e.g., left to right, or right to left in FIG. 5).

Variable RF attenuator 500 includes a first thin film resistor 512 disposed under first microstrip trace 502, and a second thin film resistor 514 disposed under second microstrip trace 504. First thin film resistor 512 is disposed such that it is interposed on first microstrip trace 502, i.e., it interposes a first end portion and a second end portion of first microstrip trace 502. Likewise, second thin film resistor 514 is disposed such that it is interposed on second microstrip trace 504, i.e., it interposes a first end portion and a second end portion of second microstrip trace 504. Variable RF attenuator 500 further includes a wire bond 516, e.g., gold, copper, or other suitable conductor, extending from a first position 518 on first microstrip trace 502 to a second position 520 on second microstrip trace 504. First position 518 and second position 520 are selected to incorporate a select number of thin film resistors (e.g., thin film resistor 512 and thin film resistor 514) into the conductive path extending longitudinally (L) and otherwise including first microstrip trace 502, wire bond 516, and second microstrip trace 504. Generally, wire bond 516 provides a low-impedance path for signal propogation. By comparison, with wire bond 516 in place, gap 506 between first microstrip trace 502 and second microstrip trace 504 is a high-impedance path over which only negligible signal coupling occurs.

Figure 6:
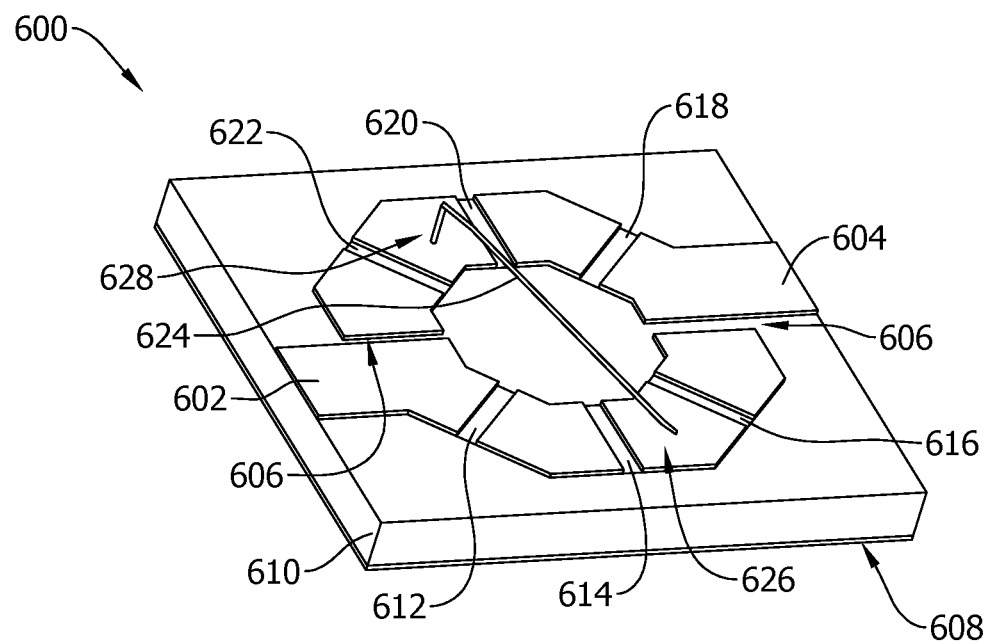
FIG. 6 is a perspective view of another example embodiment of a variable RF attenuator.
Figure 7:
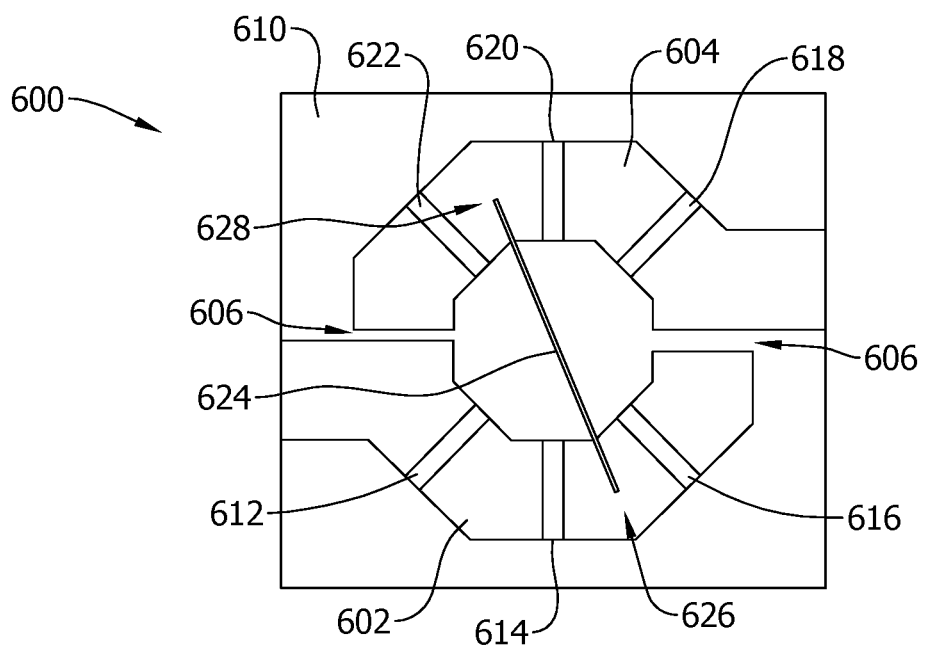
FIG. 7 is a top view of the variable RF attenuator shown in FIG. 6.

FIG. 6 is a perspective view of another example embodiment of a variable RF attenuator 600. FIG. 7 is a top view of variable RF attenuator 600. Variable RF attenuator 600 includes a first microstrip trace 602 and a second microstrip trace 604 that are uncoupled as a function of a gaps 606 between first microstrip trace 602 and second microstrip trace 604. First microstrip trace 602 and second microstrip trace 604 both extend over a ground plane 608 from which they are separated by a dielectric 610, e.g., silicon, gallium arsenide, indium phosphide, PTFE or other polymer, or any other suitable dielectric material. Generally, RF signals propagate along a conductive path extending longitudinally (e.g., left to right, or right to left in FIG. 6).

Variable RF attenuator 600 includes a first thin film resistor 612, a second thin film resistor 614, and a third thin film resistor 616 disposed under first microstrip trace 602 such that they are distributed along a length of first microstrip trace 602 and interposed between different sections of first microstrip trace 602. Variable RF attenuator 600 includes a fourth thin film resistor 618, a fifth thin film resistor 620, and a sixth thin film resistor 622 disposed under second microstrip trace 604 such that they are distributed along a length of second microstrip trace 604 and interposed between different sections of second microstrip trace 604. Variable RF attenuator 600 further includes a wire bond 624, e.g., gold, copper, or other suitable conductor, extending from a first position 626 on first microstrip trace 602 to a second position 628 on second microstrip trace 604. First position 626 and second position 628 are selected to incorporate a select number of thin film resistors (e.g., thin film resistors 612, 614, 618, and 620) into the conductive path extending longitudinally (L) and otherwise including first microstrip trace 602, wire bond 624, and second microstrip trace 604.

First microstrip trace 602 and second microstrip trace 604 are opposing generally arcuate traces. In alternative embodiments, first microstrip trace 602 and second microstrip trace 604 may be any other shape that enables interposing of thin film resistors and selective positioning of wire bond 624. The arcuate shape, for example, enables wire bond 624 to be positioned to incorporate any of thin film resistors 612, 614, 616, 618, 620, and 622 with a uniform length wire bond. Alternate shapes may include, for example, and without limitation, linear traces or polynomial traces that form, for example, parallel traces, a rectangular shape, or a circular or elliptical shape. Further, first microstrip trace 602 and second microstrip trace 604 include transition sections of conductive trace that can join other portions of the RF PCB (not shown).

Figure 8:
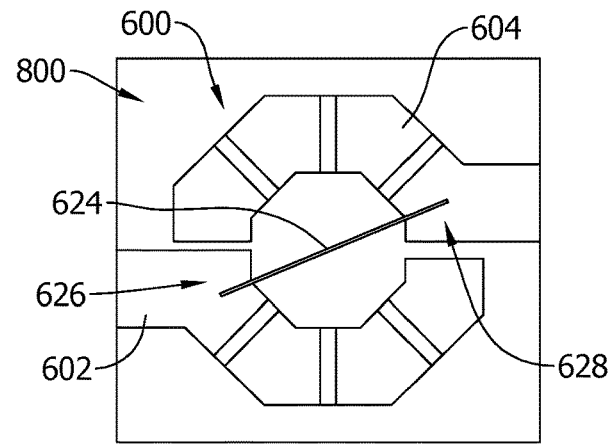
FIG. 8 is a top view of a first configuration of the variable RF attenuator shown in FIGS. 6 and 7, and a corresponding example plot of attenuation.
Figure 8:
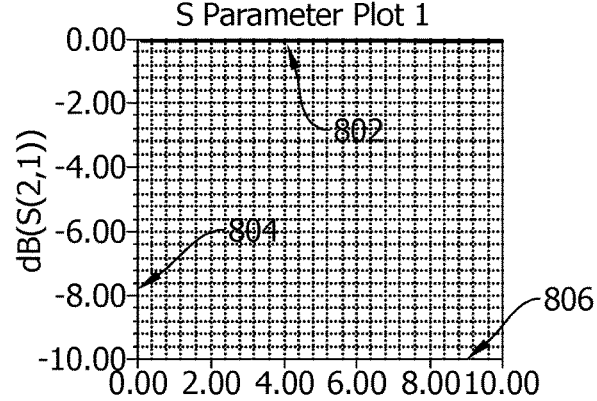

FIG. 8 is a top view of a first configuration 800 of variable RF attenuator 600 shown in FIGS. 6 and 7, and a corresponding example plot 802 of attenuation provided by variable RF attenuator 600 when in first configuration 800. In first configuration 800, wire bond 624 extends from first position 626 on first microstrip trace 602 to second position 628 on second microstrip trace 604, where the RF signal propagates from first microstrip trace 602 to second microstrip trace 604, or left to right as illustrated in FIG. 8. Notably, first position 626 on first microstrip trace 602 is selected before, or in front of thin film resistors 612, 614, and 616, thereby bypassing, or excluding, thin film resistors 612, 614, and 616 in the conductive path defined by first microstrip trace 602, wire bond 624, and second microstrip trace 604. Likewise, second position 628 on second microstrip trace 604 is selected after, or behind, thin film resistors 618, 620, and 622, thereby bypassing, or excluding, thin film resistors 618, 620, and 622 in the conductive path. Consequently, first configuration 800 of variable RF attenuator 600 should exhibit no, or zero, attenuation.

Plot 802 illustrates a frequency response, e.g., attenuation, for variable RF attenuator 600 in first configuration 800. Generally, attenuation is expressed in decibels (dB) along a vertical axis 804, ranging from 0.0 dB to −10 dB, where a larger negative number indicates greater attenuation. Attenuation is plot against frequency expressed in Gigahertz (GHz) along a horizontal axis 806, ranging from 0.0 GHz to 10 GHz. Plot 802 reflects the selection of first position 626 on first microstrip trace 602 and second position 628 on second microstrip trace 604, which produces a generally flat frequency response at 0.0 dB, or no attenuation.

Figure 9:
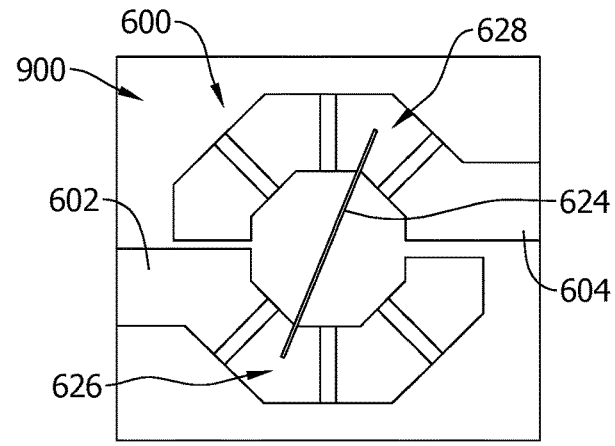
FIG. 9 is a top view of a second configuration of the variable RF attenuator shown in FIGS. 6 and 7, and a corresponding example plot of attenuation.
Figure 9:
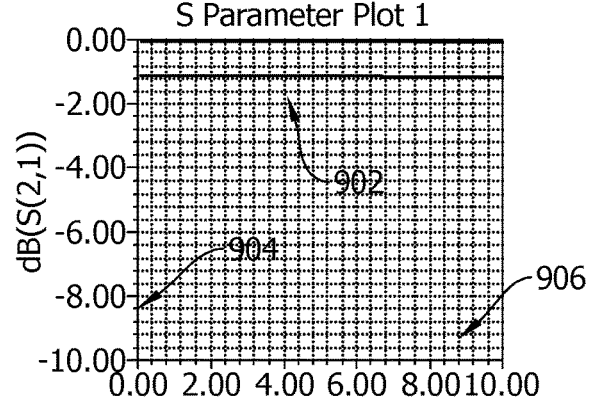

FIG. 9 is a top view of a second configuration 900 of variable RF attenuator 600 shown in FIGS. 6 and 7, and a corresponding example plot 902 of attenuation provided by variable RF attenuator 600 when in second configuration 900. In second configuration 900, wire bond 624 extends from first position 626 on first microstrip trace 602 to second position 628 on second microstrip trace 604, where the RF signal propagates from first microstrip trace 602 to second microstrip trace 604, or left to right as illustrated in FIG. 9. Notably, first position 626 on first microstrip trace 602 is selected between thin film resistors 612 and 614, thereby incorporating thin film resistor 612 and bypassing, or excluding, thin film resistors 614 and 616 in the conductive path defined by first microstrip trace 602, wire bond 624, and second microstrip trace 604. Likewise, second position 628 on second microstrip trace 604 is selected between thin film resistors 618 and 620, thereby incorporating thin film resistor 618 and bypassing, or excluding, thin film resistors 620 and 622 in the conductive path. Consequently, second configuration 900 of variable RF attenuator 600 should exhibit some attenuation as a function of the impedance introduced by thin film resistors 612 and 618.

Plot 902 illustrates a frequency response, e.g., attenuation, for variable RF attenuator 600 in second configuration 900. Generally, attenuation is expressed in dB along a vertical axis 904, ranging from 0.0 dB to −10 dB, where a larger negative number indicates greater attenuation. Attenuation is plot against frequency expressed in GHz along a horizontal axis 906, ranging from 0.0 GHz to 10 GHz. Plot 902 reflects the selection of first position 626 on first microstrip trace 602 and second position 628 on second microstrip trace 604, which produces a generally flat frequency response at about −1.0 dB attenuation.

Figure 10:
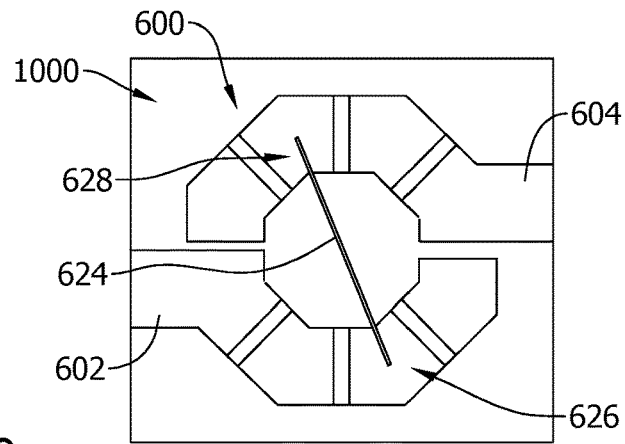
FIG. 10 is a top view of a third configuration of the variable RF attenuator shown in FIGS. 6 and 7, and a corresponding example plot of attenuation.
Figure 10:
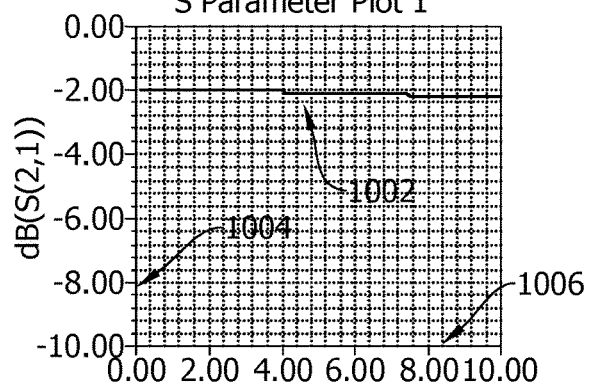

FIG. 10 is a top view of a third configuration 1000 of variable RF attenuator 600 shown in FIGS. 6 and 7, and a corresponding example plot 1002 of attenuation provided by variable RF attenuator 600 when in third configuration 1000. In third configuration 1000, wire bond 624 extends from first position 626 on first microstrip trace 602 to second position 628 on second microstrip trace 604, where the RF signal propagates from first microstrip trace 602 to second microstrip trace 604, or left to right as illustrated in FIG. 10. Notably, first position 626 on first microstrip trace 602 is selected between thin film resistors 614 and 616, thereby incorporating thin film resistors 612 and 614, and bypassing, or excluding, thin film resistor 616 in the conductive path defined by first microstrip trace 602, wire bond 624, and second microstrip trace 604. Likewise, second position 628 on second microstrip trace 604 is selected between thin film resistors 620 and 622, thereby incorporating thin film resistors 618 and 620, and bypassing, or excluding, thin film resistor 622 in the conductive path. Consequently, third configuration 1000 of variable RF attenuator 600 should exhibit some attenuation as a function of the impedance introduced by thin film resistors 612, 614, 618, and 620.

Plot 1002 illustrates a frequency response, e.g., attenuation, for variable RF attenuator 600 in third configuration 1000. Generally, attenuation is expressed in dB along a vertical axis 1004, ranging from 0.0 dB to −10 dB, where a larger negative number indicates greater attenuation. Attenuation is plot against frequency expressed in GHz along a horizontal axis 1006, ranging from 0.0 GHz to 10 GHz. Plot 1002 reflects the selection of first position 626 on first microstrip trace 602 and second position 628 on second microstrip trace 604, which produces a generally flat frequency response at about −2.0 dB attenuation.

Figure 11:
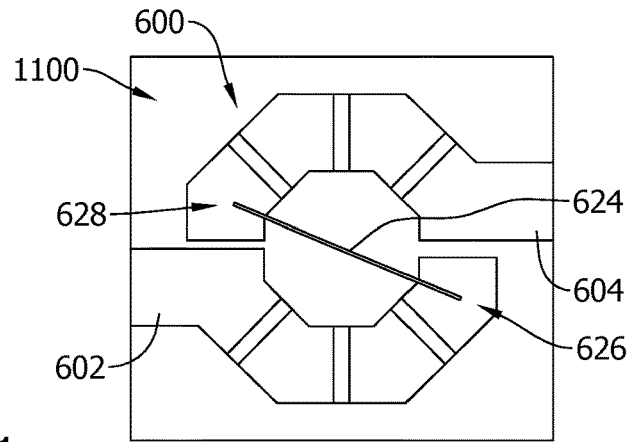
FIG. 11 is a top view of a fourth configuration of the variable RF attenuator shown in FIGS. 6 and 7, and a corresponding example plot of attenuation.
Figure 11:
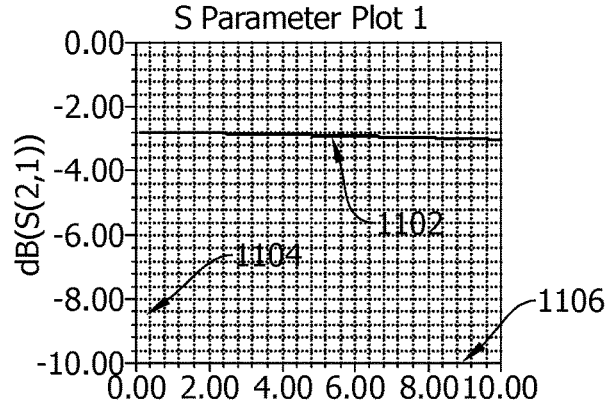

FIG. 11 is a top view of a fourth configuration 1100 of variable RF attenuator 600 shown in FIGS. 6 and 7, and a corresponding example plot 1102 of attenuation provided by variable attenuator 600 when in fourth configuration 1100. In fourth configuration 1100, wire bond 624 extends from first position 626 on first microstrip trace 602 to second position 628 on second microstrip trace 604, where the RF signal propagates from first microstrip trace 602 to second microstrip trace 604, or left to right as illustrated in FIG. 11. Notably, first position 626 on first microstrip trace 602 is selected after, or behind, thin film resistors 612, 614, and 616, thereby incorporating thin film resistors 612, 614, and 616 in the conductive path defined by first microstrip trace 602, wire bond 624, and second microstrip trace 604. Likewise, second position 628 on second microstrip trace 604 is selected after, or in front of, thin film resistors 618, 620, and 622, thereby incorporating thin film resistors 618, 620, and 622 thin film resistors in the conductive path. Consequently, fourth configuration 1100 of variable RF attenuator 600 should exhibit its greatest attenuation as a function of the impedance introduced by thin film resistors 612, 614, 616, 618, 620, and 622.

Plot 1002 illustrates a frequency response, e.g., attenuation, for variable RF attenuator 600 in fourth configuration 1100. Generally, attenuation is expressed in dB along a vertical axis 1104, ranging from 0.0 dB to −10 dB, where a larger negative number indicates greater attenuation. Attenuation is plot against frequency expressed in GHz along a horizontal axis 1106, ranging from 0.0 GHz to 10 GHz. Plot 1102 reflects the selection of first position 626 on first microstrip trace 602 and second position 628 on second microstrip trace 604, which produces a generally flat frequency response at about −2.8 dB attenuation.

Figure 12:
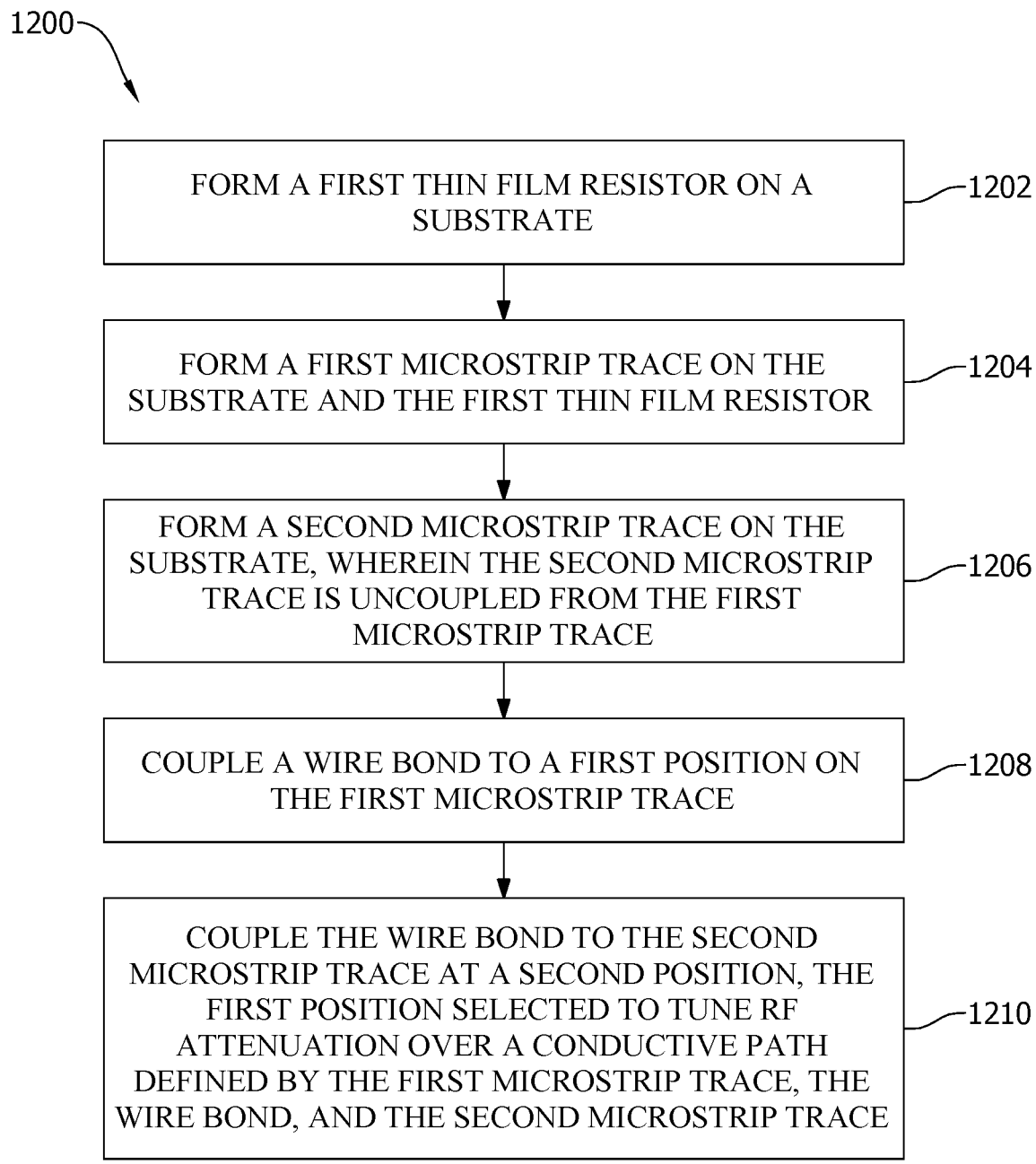
FIG. 12 is a flow diagram of an example method of fabricating a variable RF attenuator.

FIG. 12 is a flow diagram of an example method 1200 of fabricating a variable RF attenuator, such as variable RF attenuator 600, shown in FIGS. 6 and 7. Embodiments of the variable RF attenuator described herein, including variable RF attenuator 600, should include at least one thin film resistor. For example, variable RF attenuator 600 includes three thin film resistors on first microstrip trace 602. In alternative embodiments, there may be one, two, or more than three thin film resistors. Variable RF attenuator 600 is fabricated by forming 1202 first thin film resistor 612 on a substrate, such as dielectric 610. First microstrip trace 602 is then formed 1204 on dielectric 610 and first thin film resistor 612.

Second microstrip trace 604 is formed 1206 on the substrate, e.g., dielectric 610. First microstrip trace 602 and second microstrip trace 604 are formed such that they are uncoupled from each other. Wire bond 624 is coupled 1208 to first position 626 on first microstrip trace, and coupled 1210 to second position 628 on second microstrip trace. First position 626 is selected to tune RF attenuation over the conductive path defined by first microstrip trace 602, wire bond 624, and second microstrip trace 604.

In certain embodiments, forming 1204 first microstrip trace 602 includes depositing a conductive material, such as copper, for example, onto dielectric 610 using, for example, a printing process or other additive manufacturing technique. At least a portion of the conductive material is then removed, by etching, for example. The remaining conductive material defines first microstrip trace 602 having a width corresponding to a desired impedance value. In certain embodiments, first microstrip trace 602 is formed 1204 by depositing the conductive material in an arcuate shape on the substrate. In alternative embodiments, the conductive material may be deposited in any shape that enables variable RF attenuator 600 to operate as described herein. Likewise, second microstrip trace 604 may be formed 1206 in a similar manner. For example, forming 1206 second microstrip trace 604 includes depositing a conductive material on the substrate, e.g., dielectric 610, sufficiently spaced from first microstrip trace 602 to prevent electromagnetic coupling of a propagating signal between first microstrip trace 602 and second microstrip trace 604. Generally, once wire bond 624 is coupled 1208 to first microstrip trace 602 and coupled 1210 to second microstrip trace 604, wire bond 624 establishes a low-impedance path relative to the high-impedance path formed by gap 606 between first microstrip trace 602 and second microstrip trace 604.

In certain embodiments, such as variable RF attenuator 600, a plurality of thin film resistors are formed and distributed along first microstrip trace 602. Thin film resistors 612, 614, and 616 may each have different impedance and contribute different levels of attenuation or, in the alternative, thin film resistors 612, 614, and 616 may be substantially equal in their impedance and attenuation. Each of thin film resistors 612, 614, and 616 is separated from the next to enable selective coupling of wire bond 624 to first microstrip trace 602, for example, between thin film resistors 612 and 614, or between thin film resistors 614 and 616. First position 626 on first microstrip trace 602 is generally selected to incorporate at least one thin film resistor from the plurality of thin film resistors on first microstrip trace 602 to tune an RF attenuation value of variable RF attenuator 600. However, as illustrated in FIG. 8, first position 626 may be selected to bypass all of thin film resistors 612, 614, and 616 if no attenuation is desired.

Likewise, in certain embodiments, a second plurality of thin film transistors are formed and distributed along second microstrip trace 604. Thin film resistors 618, 620, and 622 may each have different impedance and contribute different levels of attenuation or, in the alternative, thin film resistors 618, 620, and 622 may be substantially equal in their impedance and attenuation. Each of thin film resistors 618, 620, and 622 is separated from the next to enable selective coupling of wire bond 624 to second microstrip trace 604, for example, between thin film resistors 618 and 620, or between thin film resistors 620 and 622. Second position 628 on second microstrip trace 604 is generally selected to incorporate zero to all of the plurality of thin film resistors on second microstrip trace 604 to tune the aggregate RF attenuation value incorporated into the conductive path defined by first microstrip trace 602, wire bond 624, and second microstrip trace 604.

Figure 13:
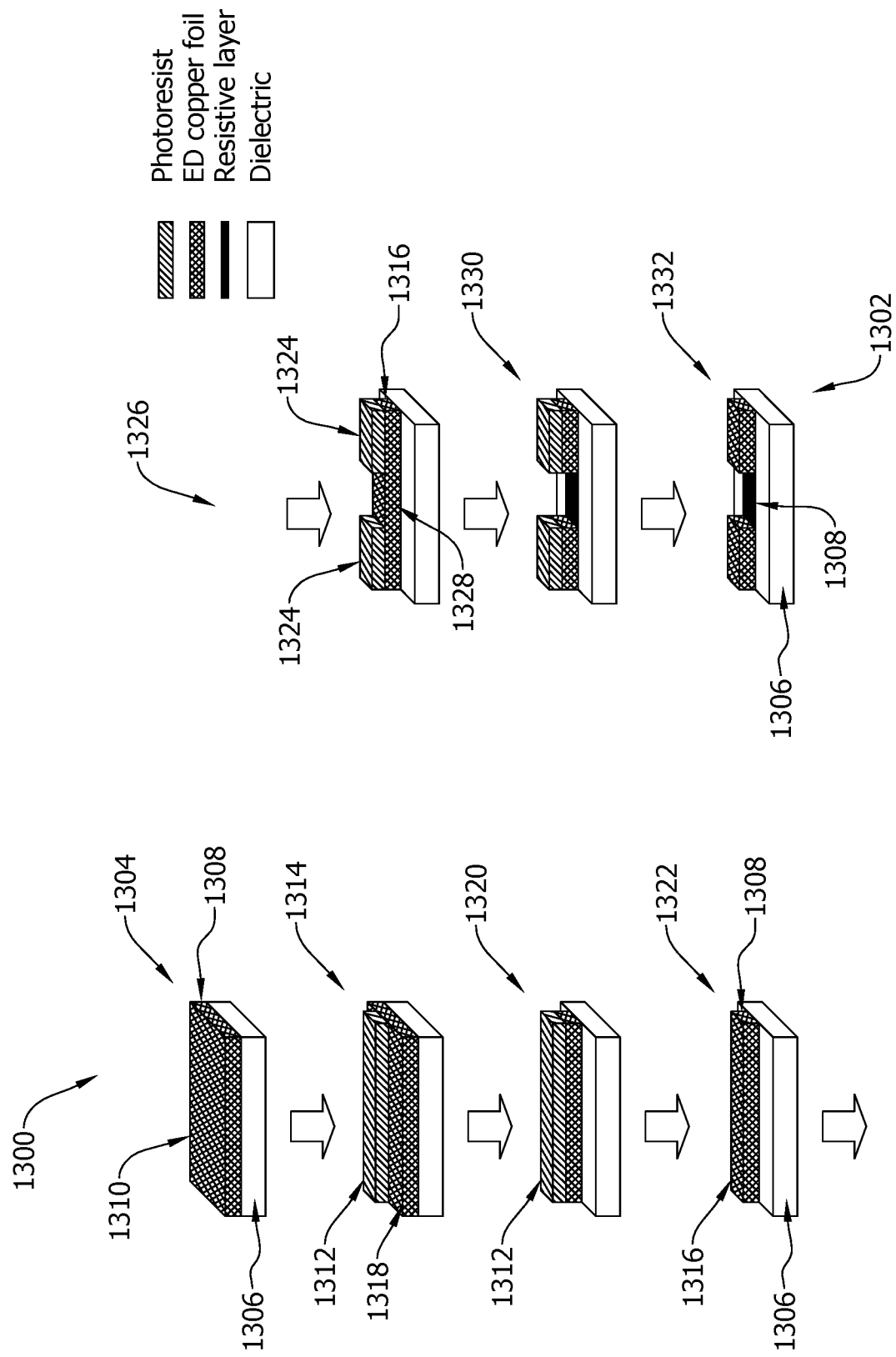
FIG. 13 is a flow diagram of an example process for fabricating a thin film resistor.

FIG. 13 is a flow diagram of an example process 1300 for fabricating a thin film resistor 1302 for use in variable RF attenuator 600 shown in FIGS. 6-11. Manufacturing of thin film resistors is generally a mature technology used in RF PCB fabrication. Process 1300 described below is one example of a process for fabricating the thin film resistors of the variable RF attenuators described herein.

Process 1300 begins with an assembly 1304 having a dielectric substrate layer 1306, a resistive layer 1308, and a copper layer 1310, where resistive layer 1308 is deposited on dielectric substrate layer 1306, and copper layer 1310 is deposited on resistive layer 1308. A photoresist strip 1312 is applied 1314 to copper layer 1310 to mask a portion of copper layer 1310 having a defined width, which may be the width, for example, of first microstrip trace 602 or second microstrip trace 604 shown in FIGS. 6-11. An unmasked portion 1318 of copper layer 1310 is removed 1320, for example, by wet etching. Photoresist strip 1312 is then removed 1322 to reveal masked portion 1316 of copper layer 1310.

Photoresist pads 1324 are applied 1326 to masked portion 1316 of copper layer 1310. Photoresist pads 1324 are displaced from each other by a resistive length 1328. The portion of copper layer 1310 extending over resistive length 1328 is removed 1330, for example, by etching, to reveal a portion of resistive layer 1308. Photoresist pads 1324 are then removed 1332 to reveal thin film resistor 1302.

Figure 14:
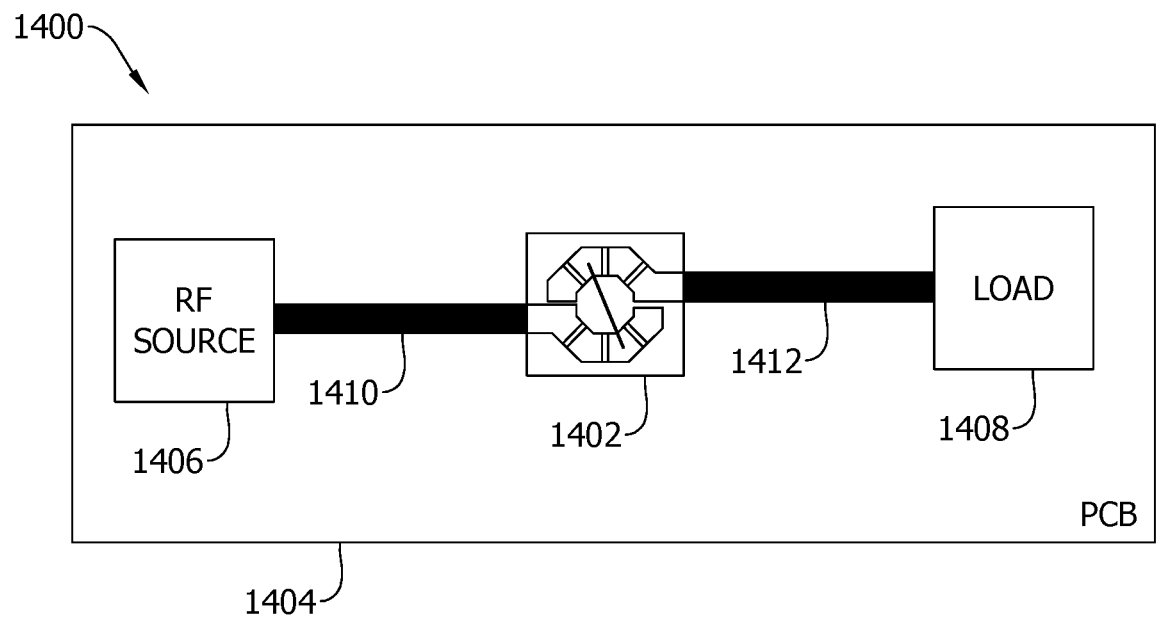
FIG. 14 is a block diagram of an example RF system including a variable RF attenuator.

FIG. 14 is a block diagram of an example RF system 1400 including a variable RF attenuator 1402. Variable RF attenuator 1402 may include, for example, variable RF attenuator 500 or variable RF attenuator 600 shown in FIGS. 5-11. RF system 1400 includes a PCB 1404 having a ground plane and a substrate, such as ground plane 608 and dielectric 610 shown in FIGS. 6-11. RF system 1400 generally includes an RF source 1406 and an RF load 1408. RF source 1406 is coupled to variable RF attenuator 1402 via a transmission line 1410. RF load 1408 is coupled to variable RF attenuator 1402 via a transmission line 1412. RF source 1406 may be any device suitable for generating an RF or microwave signal for propogation over a microstrip transmission line, through a waveguide, or other suitable RF or microwave medium. For example, RF source 1406 may include an oscillator operable in a range of 30 MHz to 300 GHz. RF load 1408 may be any RF circuit that can be placed on or coupled to PCB 1404. For example, variable RF attenuator 1402 is coupled to RF load 1408 by transmission line 1412, or microstrip trace, and may include one or more additional transmission lines or microstrip traces. RF load 1408 may also include additional passive or active components. For example, RF load 1408 may include a termination disposed on PCB 1404 for injecting the RF signal into another transmission line, such as a waveguide or other medium separate from PCB 1404. In another example, RF load 1408 may include an antenna for emitting an RF signal into a medium such as air.

Figure 15:
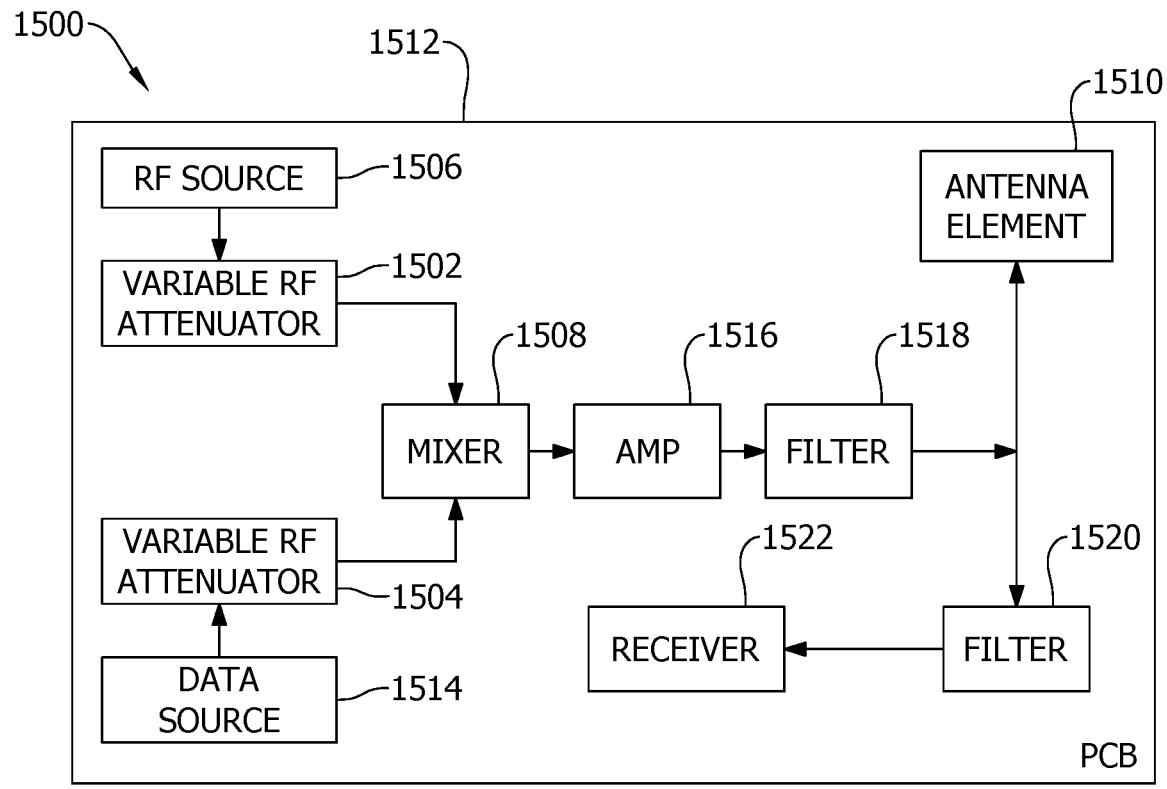
FIG. 15 is a block diagram of another example RF system including a variable RF attenuator.

FIG. 15 is a block diagram of another example RF system 1500 including a first variable RF attenuator 1502 and a second variable RF attenuator 1504. Similar to RF system 1400 shown in FIG. 14, RF system 1500 includes an RF source 1506 and an RF load. The RF load includes various passive and active components to form an RF transceiver. Generally, variable RF attenuators 1502 and 1504 operate to regulate signal amplitude going into a mixer 1508 before ultimately being transmitted by an antenna element 1510.

RF system 1500 includes a PCB 1512 having a ground plane and a substrate composed of a dielectric material, similar to ground plane 608 and dielectric 610 shown in FIG. 6. Variable RF attenuators 1502 and 1504 are integrated onto PCB 1512 along with the various other components, including, for example, RF source 1506, mixer 1508, and antenna element 1510. RF system 1500 also includes a data source 1514 that provides a data signal to second variable RF attenuator 1504. First variable RF attenuator 1502 regulates amplitude of an RF signal from RF source 1506, and second variable RF attenuator 1504 regulates amplitude of the data signal from data source 1514. Data source 1514 may include, for example, a digital signal processor (DSP), a modulator, an encoder, or other device configured to generate a baseband (e.g., sub-RF frequency) signal carrying data. Mixer 1508 combines the RF signal and the data signal for transmission. The combined signal is amplified by amplifier 1516 and filtered by filter 1518 before being supplied to antenna element 1510. The transmit path shown in FIG. 15 and described above is merely one example of how an embodiment of the variable RF attenuators described herein may be used in, for example, a communication system. RF system 1500 also includes a receive path, including a filter 1520 and a receiver 1522. The receive path likewise may utilize one or more variable RF attenuators.

An exemplary technical effect of the methods, systems, and apparatus described herein includes at least one of: (a) providing an on-board digitized RF attenuator using one or more thin film resistors disposed under microstrip traces and a wire bond between microstrip traces; (b) reducing required space to implement a variable RF attenuator; (c) reducing complexity of variable RF attenuators; (d) improving precision tuning of attenuation and impedance of variable RF attenuators; (e) producing a flat attenuation frequency response over a wide bandwidth; and (f) enabling further tuning of impedance by adjusting a length of the wire bond.

Embodiments of the systems and methods described include a variable RF attenuator and a method of fabricating a variable RF attenuator. The variable RF attenuator provides an on-board digitized RF attenuator using one or more thin film resistors disposed under microstrip traces. The variable RF attenuator also provides a compact solution for radio and microwave frequency (collectively referred to as RF) systems in place of conventional discrete, bulky, and sometimes complex devices. Embodiments of the variable RF attenuator are implemented on-board, or integrated into an RF PCB, and include first and second microstrip traces, at least one of which includes one or more thin film resistors disposed thereon. The first and second microstrip traces are uncoupled, exhibiting only negligible signal coupling over the gap between them.

Examples of the variable RF attenuator include a wire bond coupling to a position on each of the first and second microstrip traces, thereby selecting a level of attenuation by incorporating a select number of thin film resistors in the conductive path that includes the first microstrip trace, the wire bond, and the second microstrip trace. For example, the thin film resistors may be bypassed altogether (i.e., zero thin film resistors are incorporated into the conductive path). In another example, the positions of the wire bond may be selected to incorporate one thin film resistor on the first trace and two thin film resistors on the second trace. The microstrip traces and thin film resistors enable precise control of impedance and attenuation over a wide bandwidth, and consume little area on the RF PCB. The length of the wire bond enables further tuning of impedance of the variable RF attenuator, as it introduces inherent inductance into the conductive path.

The systems and methods are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for ease of illustration. In accordance with the principles of the disclosure, any feature of a drawing may be referenced and/or claimed in combination with any feature of any other drawing.

As used herein, an element or step recited in the singular and proceeded with the word "a" or "an" should be understood as not excluding plural elements or steps unless such exclusion is explicitly recited. Furthermore, references to "one embodiment" of the present disclosure or "an example embodiment" are not intended to be interpreted as excluding the existence of additional embodiments that also incorporate the recited features.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A variable radio frequency (RF) attenuator comprising:
   a substrate comprising a dielectric layer;
   a first thin film resistor disposed on the substrate;
   a first microstrip trace disposed on the substrate and the first thin film resistor;
   a second microstrip trace disposed on the substrate and uncoupled from the first microstrip trace; and
   a wire bond extending from the second microstrip trace to a position on the first microstrip trace, wherein the position is selected to tune RF attenuation over a conductive path defined by the first microstrip trace, the wire bond, and the second microstrip trace.

2. The variable RF attenuator of claim 1, wherein the first microstrip trace comprises a first end portion and a second end portion opposite the first end portion, and wherein the first thin film resistor is interposed between the first end portion and the second end portion.

3. The variable RF attenuator of claim 2, wherein the first microstrip trace further comprises an arcuate section extending from the first end portion to the second end portion, and wherein the first thin film resistor is interposed within the arcuate section.

4. The variable RF attenuator of claim 2, wherein the position on the first microstrip trace is selected on:
   a first section of the first microstrip trace extending from the first end portion to the first thin film resistor; or
   a second section of the first microstrip trace extending from the second end portion to the first thin film resistor.

5. The variable RF attenuator of claim 1, further comprising a second thin film resistor disposed under the second microstrip trace, wherein the wire bond extends from a position on the second microstrip trace, and wherein the position on the first microstrip trace and the position on the second microstrip trace are each selected to tune RF attenuation over the conductive path.

6. The variable RF attenuator of claim 1, further comprising a first plurality of thin film resistors, including the first thin film resistor, distributed along the first microstrip trace, wherein the position on the first microstrip trace is selected to incorporate at least one thin film resistor from the first plurality of thin film resistors into the conductive path to tune RF attenuation.

7. The variable RF attenuator of claim 6, further comprising a second plurality of thin film resistors distributed along the second microstrip trace, wherein the wire bond extends from a position on the second microstrip trace, and wherein the position on the first microstrip trace and the position on the second microstrip trace are each selected to tune RF attenuation over the conductive path.

8. The variable RF attenuator of claim 6, wherein each thin film resistor from the first plurality of thin film resistors provides a substantially equal value of RF attenuation.

9. The variable RF attenuator of claim 1, wherein the wire bond comprises gold.

10. A method of fabricating a variable radio frequency (RF) attenuator, the method comprising:
    forming a first thin film resistor on a substrate;
    forming a first microstrip trace on the substrate and the first thin film resistor;
    forming a second microstrip trace on the substrate, wherein the second microstrip trace is uncoupled from the first microstrip trace;
    coupling a wire bond to a first position on the first microstrip trace; and
    coupling the wire bond to the second microstrip trace at a second position, wherein the first position is selected to tune RF attenuation over a conductive path defined by the first microstrip trace, the wire bond, and the second microstrip trace.

11. The method of claim 10, wherein said forming the first microstrip trace further comprises removing at least a portion of a copper layer deposited on the substrate, a remainder of the copper layer defining at least the first microstrip trace.

12. The method of claim 10, further comprising forming a first plurality of thin film resistors, including the first thin film resistor, distributed along the first microstrip trace, wherein the first position on the first microstrip trace is selected to incorporate at least one thin film resistor from the first plurality of thin film resistors into the conductive path to tune RF attenuation.

13. The method of claim 12, further comprising forming a second plurality of thin film resistors distributed along the second microstrip trace, wherein the first position on the first microstrip trace and the second position on the second microstrip trace are each selected to tune RF attenuation over the conductive path.

14. The method of claim 13, further comprising selecting the first position and the second position to incorporate, into the conductive path, an aggregate RF attenuation value of:
    at least one thin film resistor from the first plurality of thin film resistors or the second plurality of thin film resistors; or
    at least one thin film resistor from both the first plurality of thin film resistors and the second plurality of thin film resistors.

15. The method of claim 12, wherein said forming the first plurality of thin film resistors comprises forming the first plurality of thin film resistors to each provide a substantially equal RF attenuation value.

16. The method of claim 10, wherein said forming the first microstrip trace comprises depositing a conductive material in an arcuate shape on the substrate.

17. The method of claim 10, wherein said forming the second microstrip trace comprises depositing a conductive material on the substrate sufficiently spaced from the first microstrip trace to prevent electromagnetic coupling of a propagating signal between the first microstrip trace and the second microstrip trace.

18. The method of claim 10, wherein said forming the first thin film resistor comprises:
    depositing a resistive layer on the substrate;
    depositing a copper layer on the resistive layer;
    applying a photoresist strip over at least a portion of the copper layer to define a masked portion of the copper layer;
    removing an unmasked portion of the copper layer;
    removing the photoresist strip;
    applying photoresist pads on the masked portion of the copper layer, wherein the photoresist pads are displaced from each other by a resistive length;
    removing the copper layer over the resistive length to reveal a portion of the resistive layer; and
    removing the photoresist pads to reveal the first thin film resistor.

19. A radio frequency (RF) system comprising:
a printed circuit board (PCB) having a ground plane and a substrate disposed thereon;
an RF source configured to transmit an RF signal over a first transmission line disposed on the substrate;
a second transmission line disposed on the substrate;
an RF load coupled to the second transmission line and configured to receive an attenuated RF signal; and
a variable RF attenuator disposed on the substrate and coupled between the first transmission line and the second transmission line, wherein the variable RF attenuator comprises:
a first thin film resistor disposed on the substrate;
a first microstrip trace disposed on the substrate and the first thin film resistor, wherein the first microstrip trace is coupled to the first transmission line;
a second microstrip trace disposed on the substrate and uncoupled from the first microstrip trace, wherein the second microstrip trace is coupled to the second transmission line; and
a wire bond extending from the second microstrip trace to a position on the first microstrip trace, wherein the position is selected to tune RF attenuation over a conductive path defined by the first microstrip trace, the wire bond, and the second microstrip trace.

20. The RF system of claim 19, wherein the RF load comprises:
a mixer disposed on the substrate and configured to mix the attenuated RF signal and a data signal into a combined signal;
an amplifier coupled to the mixer and configured to receive and amplify the combined signal for transmission;
a filter coupled to the amplifier and configured to filter the combined signal for transmission; and
an antenna coupled to the filter and configured to transmit the combined signal.

* * * * *